US012812793B2

(12) United States Patent
Yoneda et al.

(10) Patent No.: US 12,812,793 B2
(45) Date of Patent: Nov. 24, 2026

(54) METHOD FOR PRODUCING PRINTED WIRING BOARD WITH BUILT-IN CAPACITOR AND MULTILAYER PRINTED WIRING BOARD

(71) Applicant: MITSUI MINING & SMELTING CO., LTD., Tokyo (JP)

(72) Inventors: Yoshihiro Yoneda, Ageo (JP); Toshihiro Hosoi, Ageo (JP); Kenshiro Fukuda, Ageo (JP); Yuji Kageyama, Ageo (JP); Hiroto Iida, Ageo (JP)

(73) Assignee: MITSUI KINZOKU COMPANY, LIMITED, Tokyo (JP)

( * ) Notice: Subject to any disclaimer, the term of this patent is extended or adjusted under 35 U.S.C. 154(b) by 231 days.

(21) Appl. No.: 18/850,834

(22) PCT Filed: Mar. 7, 2023

(86) PCT No.: PCT/JP2023/008661
§ 371 (c)(1),
(2) Date: Sep. 25, 2024

(87) PCT Pub. No.: WO2023/189300
PCT Pub. Date: Oct. 5, 2023

(65) Prior Publication Data
US 2025/0227856 A1 Jul. 10, 2025

(30) Foreign Application Priority Data
Mar. 29, 2022 (JP) ................................ 2022-054344

(51) Int. Cl.
*H05K 3/46* (2006.01)
*H05K 3/06* (2006.01)

(52) U.S. Cl.
CPC ............ *H05K 3/4611* (2013.01); *H05K 3/06* (2013.01)

(58) Field of Classification Search
None
See application file for complete search history.

(56) References Cited

U.S. PATENT DOCUMENTS

2008/0257480 A1 10/2008 Nakamura
2018/0160529 A1* 6/2018 Arai ........................ H05K 3/384
(Continued)

FOREIGN PATENT DOCUMENTS

JP 2003-243795 A 8/2003
JP 2010-036350 A 2/2010
(Continued)

OTHER PUBLICATIONS

International Search Report in International Application No. PCT/JP2023/008661, dated May 30, 2023, along with English translation thereof.

*Primary Examiner* — Binh X Tran
(74) *Attorney, Agent, or Firm* — Greenblum & Bernstein, P.L.C.

(57) ABSTRACT

Provided is a method for producing a printed wiring board with built-in capacitor. This method includes: laminating a carrier-attached copper foil including a carrier, a release layer, and a first copper layer onto a first resin substrate; performing circuit formation on the first copper layer; laminating a copper clad laminated plate containing a second resin substrate and a second copper layer onto the circuit; separating the first resin substrate and the carrier from the first copper layer; etching away the first copper layer to obtain an embedded circuit board; laminating the embedded circuit board onto a resin-coated copper foil containing a resin layer composed of a semi-cured state resin having a maximum value of logarithmic decrement of 0.02 or more and a copper layer; and curing the resin to form a dielectric layer with a thickness of 30 μm or less.

5 Claims, 5 Drawing Sheets

(56) References Cited

U.S. PATENT DOCUMENTS

| | | | | |
|---|---|---|---|---|
| 2018/0288884 | A1* | 10/2018 | Ori | H05K 3/4655 |
| 2018/0332721 | A1* | 11/2018 | Shimizu | H05K 3/4652 |
| 2020/0122431 | A1 | 4/2020 | Ooshima et al. | |
| 2022/0115723 | A1* | 4/2022 | Yasuda | B32B 7/12 |
| 2022/0173461 | A1* | 6/2022 | Tatsuzawa | H01G 11/78 |
| 2022/0351906 | A1 | 11/2022 | Ishizuka et al. | |
| 2024/0014112 | A1* | 1/2024 | Tsuyutani | H05K 3/46 |

FOREIGN PATENT DOCUMENTS

| | | | |
|---|---|---|---|
| JP | 2019-014118 | A | 1/2019 |
| WO | WO2006/016586 | A1 | 2/2006 |
| WO | WO2009/008471 | A1 | 1/2009 |
| WO | WO2017/085849 | A1 | 5/2017 |
| WO | WO2017/086418 | A1 | 9/2018 |
| WO | WO2021/0251288 | A1 | 12/2021 |
| WO | WO2021/251288 | A1 | 12/2021 |

* cited by examiner

METHOD FOR PRODUCING PRINTED WIRING BOARD WITH BUILT-IN CAPACITOR AND MULTILAYER PRINTED WIRING BOARD

TECHNICAL FIELD

The present invention relates to a method for producing a printed wiring board with built-in capacitor and a multilayer printed wiring board.

BACKGROUND ART

Printed wiring boards are widely used in electronic communication devices such as portable electronic devices. In particular, as portable electronic communication devices and other devices have become lighter, thinner, shorter, smaller, and more highly functional in recent years, reducing noise in printed wiring boards has become an issue, for example. Capacitors are important for enabling noise reduction, but in order to realize high functionality, it is desirable for capacitors to be small enough and thin enough to be incorporated into the inner layers of printed wiring boards.

Various methods have been proposed for producing multilayer printed wiring boards including built-in capacitor circuits. For example, Patent Literature 1 (WO2006/016586) discloses a method for producing a multilayer printed wiring board, the method including providing a dielectric layer and a first conductive metal layer on the surface having a base electrode of a core material, processing the first conductive metal layer into top electrodes, removing the exposed dielectric layer, filling the gaps among the top electrodes and providing an insulating layer and a second conductive metal layer on the top electrodes, and processing the second conductive metal layer into outer layer circuits. Also, Patent Literature 2 (WO2017/086418) discloses a method for producing a printed wiring board that has a dielectric layer with a thickness of 30 μm or less, the method including providing a pair of metal clad laminated plates having the configuration of first carrier/release layer/first metal foil/dielectric layer/second metal foil/release layer/second carrier, laminating the metal clad laminated plates onto each side of a resin substrate on the first carrier side, peeling off the second carrier from the laminated body obtained, etching the second metal foil exposed to form a conductor pattern, laminating an insulating layer onto the conductor pattern and laminating a metal layer onto the insulating layer, and separating the laminated body between the first carrier and the first metal foil.

Double-sided copper clad laminates for the production of printed wiring boards with built-in capacitor have also been proposed. For example, Patent Literature 3 (WO2021/251288) discloses a double-sided copper clad laminate including an adhesive layer and a copper foil in the order presented, on each of both sides of a resin film, and describes that the resin film is in a cured state at 25° C., and in both copper foils, the maximum peak height Sp measured in accordance with ISO 25178 on the surface on the side in contact with the adhesive layer is 0.05 μm or more and 3.3 μm or less.

CITATION LIST

Patent Literature

Patent Literature 1: WO2006/016586
Patent Literature 2: WO2017/086418
Patent Literature 3: WO2021/251288

SUMMARY OF INVENTION

Currently, for example, printed wiring boards with built-in capacitor using double-sided copper clad laminates are manufactured according to the procedures as shown in FIGS. 3A and 3B. Specifically, a double-sided copper clad laminate 110 including copper layers 114 on both sides of a resin layer 112 is provided (FIG. 3A (i)). A support 116 is adhered to one side of the double-sided copper clad laminate 110 (FIG. 3A (ii)). The copper layer 114 on the opposite side to the support 116 in the double-sided copper clad laminate 110 is subjected to patterning to form a circuit 118 (FIG. 3A (iii)). The support 116 is removed from the laminated plate on which the circuit 118 has been formed (FIG. 3B (iv)). A copper clad laminate 120 containing a resin substrate 122 and a copper layer 124 is pressed at a high temperature (for example, 230° C.) onto the side of the circuit-formed laminated plate from which the support 116 has been removed and where the circuit 118 is present (FIG. 3B (v)). In this way, a built-in capacitor circuit including the resin layer 112 as a dielectric layer is obtained.

Incidentally, as mentioned above, in order to realize high functionality, it is desirable for capacitors to be small enough and thin enough to be incorporated into the inner layers of printed wiring boards. From such a viewpoint, double-sided copper clad laminates with a thin thickness (for example, the thickness of the resin layer is 30 μm or less, 20 μm or less, or 10 μm or less) are used. However, in the case where such thin copper clad laminates are used in the current construction method described above, there is a risk that the resin layer is broken due to the folding of the substrate. For example, when forming the circuit 118 in FIG. 3A (iii), if some stress is applied after the circuit etching, cracks may occur near the edges of the circuit 118. Also, if a large force is applied when removing the support 116 in FIG. 3B (iv), cracks may occur near the edges of the circuit 118. Furthermore, when pressing the copper clad laminate 120 in FIG. 3B (v), stress may occur due to the influence of thermal expansion or thermal contraction, which may cause cracks near the edges of the circuit 118. This is because there is a tendency that the coefficient of thermal expansion (CTE) of the resin substrate 122 in the copper clad laminate 120 is low, whereas the coefficient of thermal expansion (CTE) of the resin layer 112 for capacitors is high, and thus it is greatly affected by thermal expansion and thermal contraction.

The inventors have recently found that, by laminating a pre-formed embedded circuit board on a resin-coated copper foil containing a predetermined resin in a semi-cured state and curing the resin, a printed wiring board with built-in capacitor that is excellent in adhesion between a circuit and a dielectric layer can be produced by a method that allows easy control of the thickness of the dielectric layer and high productivity while reducing the risk of breakage of the resin layer.

Accordingly, an object of the present invention is to produce a printed wiring board with built-in capacitor that is excellent in adhesion between a circuit and a dielectric layer by a method that allows easy control of the thickness of the dielectric layer and high productivity while reducing the risk of breakage of the resin layer.

The present invention provides the following aspects:

[Aspect 1]

A method for producing a printed wiring board with built-in capacitor that has a dielectric layer with a thickness of 30 μm or less, the method comprising the steps of:

(a) laminating a carrier-attached copper foil comprising a carrier, a release layer, and a first copper layer in sequence, onto at least one side of a first resin substrate such that the carrier is in contact with the first resin substrate;

(b) performing circuit formation on the first copper layer of the carrier-attached copper foil, thereby obtaining a laminated body comprising a circuit on at least one side;

(c) laminating a copper clad laminate containing a second resin substrate and a second copper layer onto the circuit on at least one side of the laminated body such that the circuit is embedded in the second resin substrate;

(d) separating the first resin substrate and the carrier from the first copper layer via the release layer;

(e) etching away the first copper layer to expose, on a surface, the circuit embedded in the second resin substrate, thereby obtaining an embedded circuit board;

(f) laminating the embedded circuit board onto a resin-coated copper foil containing a resin layer composed of a resin in a semi-cured state and a copper layer such that the circuit is in contact with the resin layer, wherein the resin in a semi-cured state has a maximum value of logarithmic decrement of 0.02 or more as measured with a rigid-body pendulum type physical properties testing instrument in a temperature range of 30° C. to 220° C. at a temperature increase rate of 5° C./minute in accordance with ISO 12013-1 or ISO 12013-2; and (g) curing the resin in a semi-cured state to form a dielectric layer with a thickness of 30 μm or less, thereby obtaining a built-in capacitor circuit.

[Aspect 2]

The method for producing a printed wiring board with built-in capacitor according to aspect 1, wherein the maximum value of logarithmic decrement is 0.2 or more and 2.0 or less.

[Aspect 3]

The method for producing a printed wiring board with built-in capacitor according to aspect 1 or 2, wherein in the embedded circuit board obtained in the step (e), a maximum value of height difference between a surface of the second resin substrate and a surface of the circuit embedded in the second resin substrate is 0.5 μm or less.

[Aspect 4]

The method for producing a printed wiring board with built-in capacitor according to any one of aspects 1 to 3, wherein a thickness variation in the dielectric layer is ±15% or less.

[Aspect 5]

A method for producing a multilayer printed wiring board, comprising the step of laminating a plurality of built-in capacitor circuits produced by the method according to any one of aspects 1 to 4.

DESCRIPTION OF EMBODIMENTS

Figure 1A:
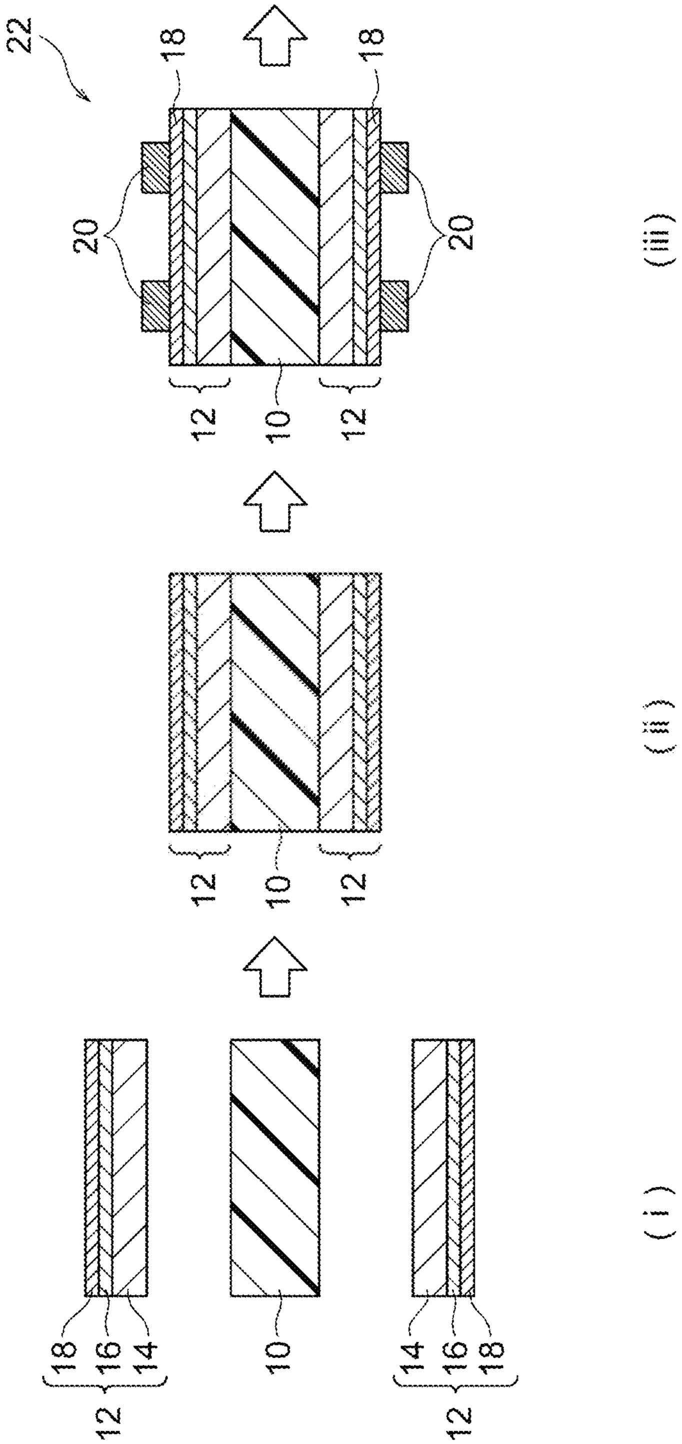
FIG. 1A is a flow diagram showing the first half of the steps of the method for producing a printed wiring board with built-in capacitor according to the present invention.
Figure 1B:
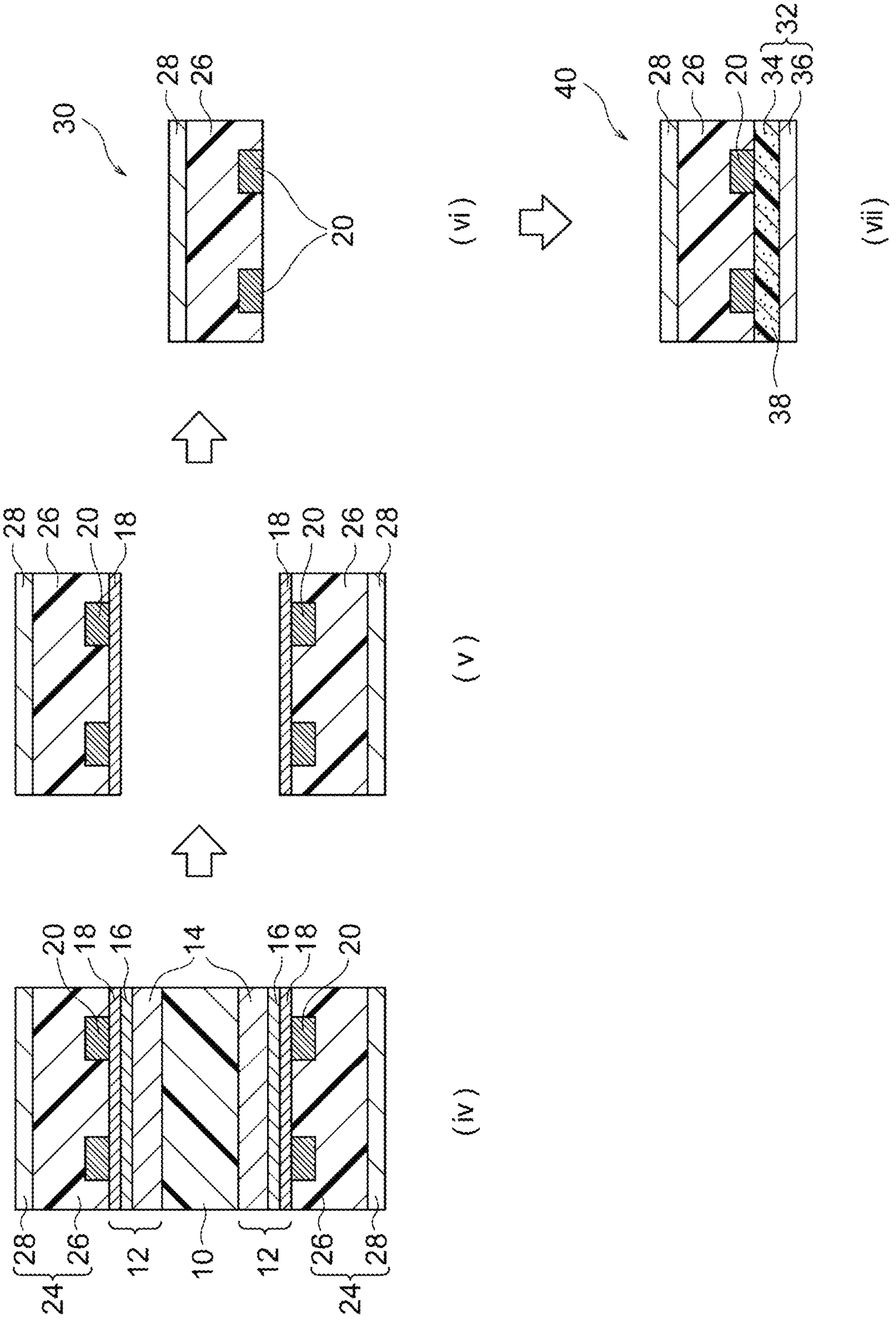
FIG. 1B is a flow diagram showing the latter half of the steps of the method for producing a printed wiring board with built-in capacitor according to the present invention, following FIG. 1A.

The present invention relates to a method for producing a printed wiring board with built-in capacitor. The printed wiring board with built-in capacitor has a dielectric layer with a thickness of 30 μm or less. FIGS. 1A and 1B show a series of steps in the method for producing a printed wiring board with built-in capacitor. As will be described in detail later, this production method includes each of the following steps: (a) lamination of a carrier-attached copper foil 12 onto a first resin substrate 10; (b) formation of a circuit 20; (c) lamination of a copper clad laminate 24; (d) separation of the first resin substrate 10 and a carrier 14; (e) formation of an embedded circuit board 30 by etching; (f) lamination of the embedded circuit board 30 onto a resin-coated copper foil 32; and (g) curing of the resin. In particular, the resin-coated copper foil 32 contains a resin layer 34 composed of a resin in a semi-cured state and a copper layer 36. The resin in a semi-cured state has a maximum value of logarithmic decrement of 0.02 or more as measured with a rigid-body pendulum type physical properties testing instrument in the temperature range of 30° C. to 220° C. at a temperature increase rate of 5° C./minute. According to this method, by laminating the pre-formed embedded circuit board 30 onto the resin-coated copper foil 32 containing a predetermined resin in a semi-cured state and curing the resin, a printed wiring board with built-in capacitor 40 that is excellent in adhesion between the circuit 20 and a dielectric layer 38 can be produced by the method allowing easy control of the thickness of the dielectric layer 38 and high productivity while reducing the risk of breakage of the resin layer 34.

Figure 3A:
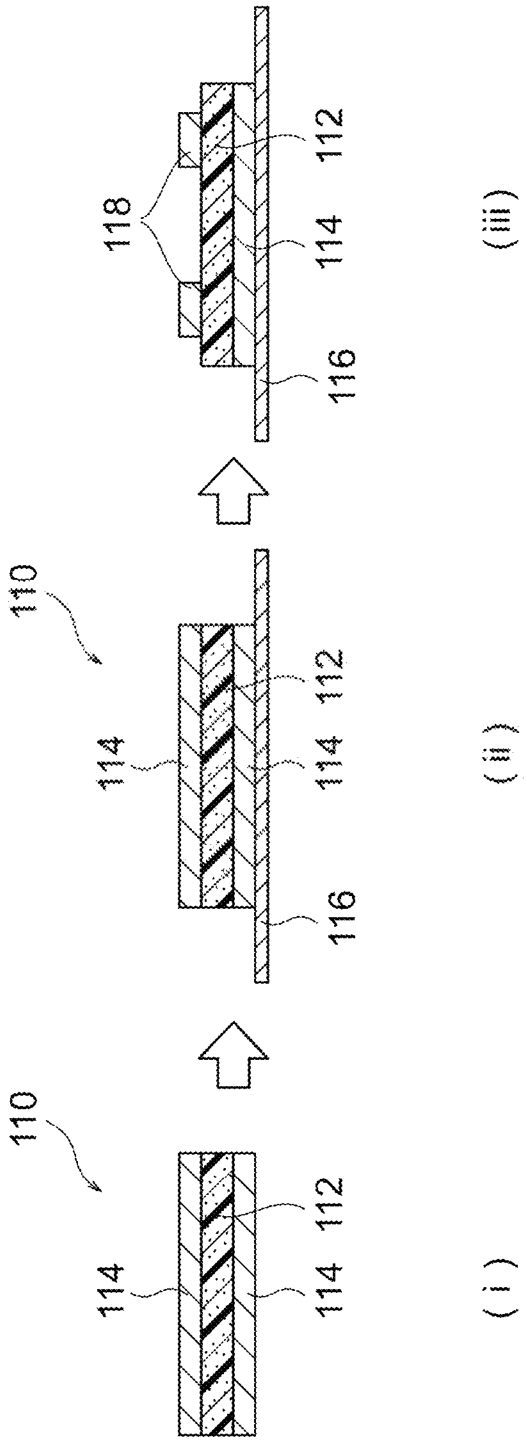
FIG. 3A is a flow diagram showing the first half of the steps of the current method for producing a printed wiring board with built-in capacitor using a double-sided copper clad laminate.
Figure 3B:
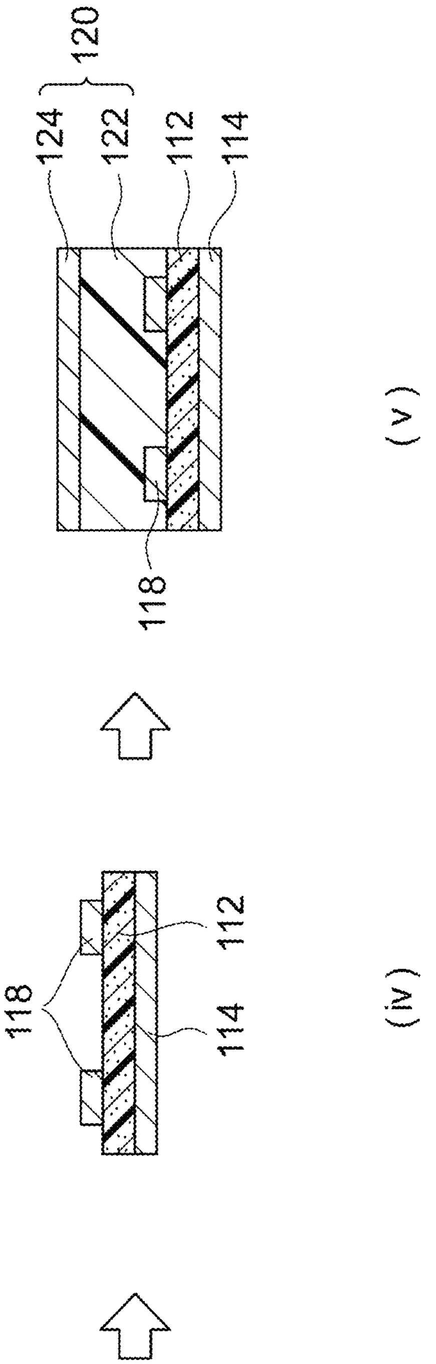
FIG. 3B is a flow diagram showing the latter half of the steps of the current method for producing a printed wiring board with built-in capacitor using a double-sided copper clad laminate, following FIG. 3A.

As mentioned above, in the current construction method, there is a risk that the resin layer is broken due to the folding of the substrate. For example, when forming the circuit 118 in FIG. 3A (iii), if some stress is applied after the circuit etching, cracks may occur near the edges of the circuit 118. Also, if a large force is applied when removing the support 116 in FIG. 3B (iv), cracks may occur near the edges of the circuit 118. Furthermore, when pressing the copper clad laminate 120 in FIG. 3B (v), stress may occur due to the influence of thermal expansion or thermal contraction, which may cause cracks near the edges of the circuit 118. This is because there is a tendency that the coefficient of thermal expansion (CTE) of the resin substrate 122 in the copper clad laminate 120 is low, whereas the coefficient of thermal expansion (CTE) of the resin layer 112 for capacitors is high, and thus it is greatly affected by thermal expansion and thermal contraction. These problems are eliminated by the method of the present invention. That is, in the current construction method, as shown in FIGS. 3A and 3B, the double-sided copper clad laminate 110 including the copper layers 114 on both sides of the resin layer 112 is provided first, and then subjected to each of the following steps in sequence: adhesion of the support 116; formation of the circuit 118; removal of the support 116; and pressing of the copper clad laminate 120, thus, in turn, providing many opportunities for stress to be applied to the resin layer 112, which will serve as the dielectric layer. However, in the method of the present invention, the resin-coated copper foil 32 containing a resin in a semi-cured state is laminated in the final step after the formation of the embedded circuit board 30, and therefore, various steps that may apply stress to the resin layer 34, which will serve as the dielectric layer 38, such as those described above, can be avoided, and as a result, the risk of breakage of the resin layer 34 can be significantly reduced. In addition, when the carrier-attached copper foils 12 are laminated onto both sides of the first resin substrate 10 and the circuit formation and subsequent steps are performed, the number of built-in capacitor circuit boards to be obtained is two, thus doubling the production efficiency. Furthermore, by setting the maximum value of logarithmic decrement of the resin in a semi-cured state used for the resin-coated copper foil 32 to 0.02 or more, the adhesion between the embedded circuit 20 and the dielectric layer 38 is more easily ensured. Moreover, since the resin-coated copper foil 32 (unlike the double-sided copper clad laminate as shown in FIG. 3A) is only required to have a configuration in which the copper layer 36 is provided only on one side of the resin layer 34, there is also an advantage that the design flexibility of the resin layer 34 and the copper layer 36 is improved and that the thickness of the dielectric layer 38 (formed by curing of the resin layer 34) is easily controlled by controlling the thickness of the resin layer 34 at will. Besides, since the resin-coated copper foil 32 can be stored in the form of a roll and the storage space for the resin-coated copper foil 32 can be made more efficient, productivity is expected to be improved.

FIGS. 1A and 1B show a series of steps in the method for producing a printed wiring board with built-in capacitor. Hereinafter, each of the steps (a) to (g) will be described with reference to these figures.

(a) Lamination of Carrier-Attached Copper Foil onto First Resin Substrate

As shown in FIG. 1A (i) and (ii), the carrier-attached copper foil 12 is laminated onto at least one side of the first resin substrate 10 (step (a)). The carrier-attached copper foil 12 includes the carrier 14, a release layer 16, and a first copper layer 18 in the order presented, and the lamination is performed such that the carrier 14 is in contact with the first resin substrate 10. This lamination is preferably performed by vacuum pressing. At this time, it is preferable to laminate the carrier-attached copper foils 12 onto both sides of the first resin substrate 10. As a result, the production efficiency is doubled, which further improves productivity.

For the first resin substrate 10, any known resin substrate may be used, and there is no particular limitation. The first resin substrate 10 may be a prepreg. The prepreg is a generic term for composite materials in which a substrate such as synthetic resin plate, glass plate, glass woven fabric, glass non-woven fabric, or paper is impregnated with a synthetic resin. Preferred examples of the insulating resin with which the prepreg is impregnated include an epoxy resin, a cyanate resin, a bismaleimide triazine resin (BT resin), a polyphenylene ether resin, and a phenolic resin. The thickness of the first resin substrate 10 is preferably 10 μm or more and 1000 μm or less, more preferably 20 μm or more and 400 μm or less, and still more preferably 40 μm or more and 250 μm or less.

For the carrier-attached copper foil 12, any known material may be used, and there is no particular limitation. A typical aspect of each layer will be described below.

The carrier 14 is a support for supporting the first copper layer 18 to improve its handleability, and a typical carrier contains a metal layer. Examples of such a carrier include an aluminum foil, a copper foil, a stainless steel (SUS) foil, and a resin film or glass with its surface metal-coated with copper or other metals, and it is preferably a copper foil. The copper foil may be either a rolled copper foil or an electrodeposited copper foil, but is preferably an electrodeposited copper foil. The thickness of the carrier is typically 250 μm or less, preferably 7 μm or more and 200 μm or less.

The release layer 16 is a layer that functions to weaken the release strength of the carrier, to ensure the stability of that strength, and further to suppress possible interdiffusion between the carrier and the copper foil during pressing at high temperature. The release layer is generally formed on one side of the carrier, but may be formed on both sides. The release layer may be either an organic release layer or an inorganic release layer. Examples of the organic components used in the organic release layer include a nitrogen-containing organic compound, a sulfur-containing organic compound, and a carboxylic acid. Examples of the nitrogen-containing organic compound include a triazole compound and an imidazole compound, and among them, a triazole compound is preferable since releasability is likely to be stabilized. Examples of the triazole compound include 1,2,3-benzotriazole, carboxybenzotriazole, N',N'-bis(benzotriazolylmethyl)urea, 1H-1,2,4-triazole, and 3-amino-1H-1,2,4-triazole. Examples of the sulfur-containing organic compound include mercaptobenzothiazole, thiocyanuric acid, and 2-benzimidazolethiol. Examples of the carboxylic acid include a monocarboxylic acid and a dicarboxylic acid. Meanwhile, examples of the inorganic components used in the inorganic release layer include Ni, Mo, Co, Cr, Fe, Ti, W, P, Zn, and a chromate-treated film. Note that formation of the release layer may be performed by bringing a release layer component-containing solution into contact with at least one surface of the carrier and fixing the release layer components to the surface of the carrier, or by other means. In the case where the carrier is brought into contact with the release layer component-containing solution, this contact may be performed by immersion in the release layer component-containing solution, spraying of the release layer component-containing solution, or flowing down of the release layer component-containing solution. In addition, methods in which the release layer components are formed into a film by the gas-phase method such as vapor deposition or sputtering can also be employed. Also, the fixation of the release layer components to the carrier surface may be performed by adsorption or drying of the release layer component-containing solution, electrodeposition of the release layer components in the release layer component-containing solution, or other means. The thickness of the release layer is typically 1 nm or more and 1 μm or less, preferably 5 nm or more and 500 nm or less.

If desired, other functional layers may be provided between the release layer 16 and the carrier 14 and/or the first copper layer 18. Examples of such other functional layers include an auxiliary metal layer. The auxiliary metal layer is preferably composed of nickel and/or cobalt. By forming such an auxiliary metal layer on the surface side of the carrier 14 and/or on the surface side of the first copper layer 18, the possible interdiffusion between the carrier 14 and the first copper layer 18 during hot pressing at high temperature or for a long time can be suppressed and the stability of the release strength of the carrier can be ensured. The thickness of the auxiliary metal layer is preferably set to 0.001 μm or more and 3 μm or less.

The first copper layer 18 is preferably a roughened copper foil. The roughened copper foil has a roughened surface on at least one side. That is, the roughened copper foil may have roughened surfaces on both sides or may have a roughened surface on only one side. The roughened surface includes a plurality of roughened particles, and each of these plurality of roughened particles is preferably composed of a copper particle. The copper particle may be composed of metallic copper or may be composed of a copper alloy. The roughened copper foil preferably further includes a rustproof layer and/or a silane coupling agent layer on the roughened surface, and more preferably includes both a rustproof layer and a silane coupling agent layer. The rustproof layer and the silane coupling agent layer may be formed not only on the roughened surface side of the roughened copper foil, but also on the side where the roughened surface is not formed.

Although the thickness of the first copper layer 18 is not particularly limited, it is preferably 0.1 μm or more and 35 μm or less, more preferably 0.5 μm or more and 5.0 μm or less, and still more preferably 1.0 μm or more and 3.0 μm or less.

(b) Circuit Formation

As shown in FIG. 1A (iii), the circuit 20 is formed on the first copper layer 18 of the carrier-attached copper foil 12, thereby obtaining a laminated body 22 including the circuit 20 on at least one side (preferably on both sides) (step (b)). The formation of the circuit 20 may be performed by subjecting the side on which the first copper layer 18 of the carrier-attached copper foil 12 is present to a process such as photoresist processing, pattern copper plating, and photoresist removal. For example, the subtractive process, modified semi-additive process (MSAP), semi-additive process (SAP), and full additive process can be used.

(c) Lamination of Copper Clad Laminate

As shown in FIG. 1B (iv), the copper clad laminate 24 containing a second resin substrate 26 and a second copper layer 28 is laminated onto the circuit 20 on at least one side (preferably on both sides) of the laminated body 22 such that the circuit 20 is embedded in the second resin substrate 26 (step (c)). For the copper clad laminate 24, any known copper clad laminate may be used, and there is no particular limitation. The second resin substrate 26 may be a prepreg. The prepreg is a generic term for composite materials in which a substrate such as synthetic resin plate, glass plate, glass woven fabric, glass non-woven fabric, or paper is impregnated with a synthetic resin. Preferred examples of the insulating resin with which the prepreg is impregnated include an epoxy resin, a cyanate resin, a bismaleimide triazine resin (BT resin), a polyphenylene ether resin, and a phenolic resin. The thickness of the second resin substrate 26 is preferably 10 μm or more and 1000 μm or less, more preferably 20 μm or more and 400 μm or less, and still more preferably 40 μm or more and 250 μm or less. The thickness of the second copper layer 28 is preferably 0.1 μm or more and 100 μm or less, more preferably 0.5 μm or more and 70 μm or less, and still more preferably 2 μm or more and 35 μm or less.

(d) Separation of First Resin Substrate and Carrier

As shown in FIG. 1B (iv) and (v), the first resin substrate 10 and the carrier 14 are separated from the first copper layer 18 via the release layer 16 (step (d)). That is, the first resin substrate 10 is separated and removed together with the carrier 14 as a dummy core. At that time, the release layer 16 is also mostly removed along with the carrier 14, and in the remaining laminated body, the first copper layer 18 is mostly exposed, ready for etching. Note that, although traces of the release layer 16 may remain on the first copper layer 18, they are minute and thus do not interfere with the subsequent etching step.

(e) Formation of Embedded Circuit Board by Etching

Figure 2:
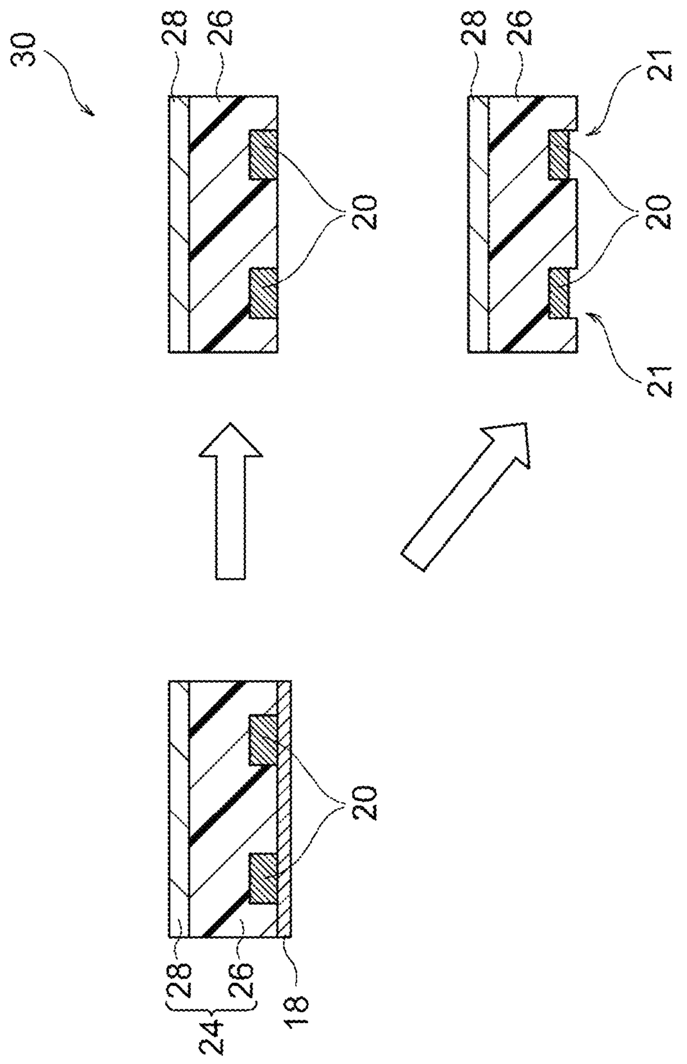
FIG. 2 is a schematic cross-sectional view contrasting the presence and absence of circuit depressions (height difference between the surface of the substrate and the surface of the embedded circuit) in an embedded circuit.

As shown in FIG. 1B (vi), the first copper layer 18 is etched away to expose the circuit 20 embedded in the second resin substrate 26 on the surface, thereby obtaining the embedded circuit board 30 (step (e)). At this time, etching removal of the first copper layer 18 is ideally performed such that the circuit 20 does not form depressions with respect to the surface of the second resin substrate 26 (height difference between the surface of the second resin substrate 26 and the surface of the circuit 20 embedded in the second resin substrate 26) and such that the surface of the second resin substrate 26 and the surface of the embedded circuit 20 are as close as possible to the same height (ideally, the surface of the second resin substrate 26 and the surface of the embedded circuit 20 form one continuous plane, as shown in the upper row of FIG. 2), from the viewpoint of adhesion to the resin layer 34 or dielectric layer 38, which will be described later. However, etching is not easy to control and may result in depressions 21 in the circuit 20 portions, as shown in the lower row of FIG. 2. In this case, in the embedded circuit board 30, the maximum value of height difference between the surface of the second resin substrate 26 and the surface of the circuit embedded in the second resin substrate 26 is preferably 0.5 μm or less, more preferably 0.3 μm or less, still more preferably 0.1 μm or less, and particularly preferably 0.05 μm or less. As will be described later, the resin in a semi-cured state used in the present invention can flow to some extent and can fill the depressions 21, thus enabling adhesion between the circuit 20 and the dielectric layer 38 (that is, the resin layer 34 after curing) even if the depressions 21 are present.

(f) Lamination of Embedded Circuit Board onto Resin-Coated Copper Foil

As shown in FIG. 1B (vii), the embedded circuit board 30 is laminated onto the resin-coated copper foil 32 (step (f)). The resin-coated copper foil 32 contains the resin layer 34, which is composed of a resin in a semi-cured state, and the copper layer 36, and the lamination is performed such that the circuit 20 is in contact with the resin layer 34. In the resin in a semi-cured state, the maximum value of logarithmic decrement measured with a rigid-body pendulum type physical properties testing instrument in the temperature range of 30° C. to 220° C. at a temperature increase rate of 5° C./minute in accordance with ISO 12013-1 or ISO 12013-2 is 0.02 or more, preferably 0.05 or more and 2.0 or less, more preferably 0.1 or more and 2.0 or less, and still more preferably 0.3 or more and 2.0 or less. As a result, the adhesion between the embedded circuit 20 and the dielectric layer 38 is more easily ensured. That is, as mentioned above, the etching in the step (e) is not easy to control and may result in the depressions 21 in the circuit 20 portions. However, the resin in a semi-cured state having the above logarithmic decrement can flow to some extent and can fill the depressions 21. That is, by using a resin with a large logarithmic decrement as described above, the adhesion between the circuit 20 and the dielectric layer 38 (that is, the resin layer 34 after curing) can be achieved even if the depressions 21 are present. However, when the logarithmic decrement is too large, the resin tends to flow easily and thickness variation is difficult to control, and therefore, a logarithmic decrement within the above range is advantageous. Note that, although the resin flow is a well-known index of resin flowability, resins for capacitors are inherently designed to be difficult to flow and cannot be evaluated by the resin flow, and therefore, the logarithmic decrement by a rigid-body pendulum type physical properties testing instrument is used as an index in the present invention.

Although the thickness of the copper layer 36 is not particularly limited and may be determined as appropriate depending on the specific application of the resin-coated copper foil, it is preferably 0.1 μm or more and 100 μm or less, more preferably 0.5 μm or more and 70 μm or less, still more preferably 2 μm or more and 70 μm or less, particularly preferably 10 μm or more and 70 μm or less, and most preferably 10 μm or more and 35 μm or less. When the thickness is within these ranges, the modified semi-additive process (MSAP), semi-additive process (SAP), subtractive process, and other construction methods, which are common methods for forming wiring patterns on printed wiring boards, can be employed. Also, in the case where the thickness of the copper layer 36 is very thin (for example, 10 μm or less), the resin-coated copper foil 32 used in the present invention may be a carrier-attached copper foil including a release layer and a carrier for improved handleability, with the resin layer 34 formed on the copper foil surface thereof.

The surface of the copper layer 36 in contact with the resin layer 34 preferably has a low roughness from the viewpoint of easy control of the thickness of the resin layer 34. From this viewpoint, when the surface roughness of the copper layer 36 on the side in contact with the resin layer 34 is represented as the ten-point average roughness, Rzjis, as measured in accordance with JIS B0601-2001, the Rzjis is preferably 2.0 μm or less, more preferably 1.5 μm or less, still more preferably 1.0 μm or less, and particularly preferably 0.5 μm or less. As a result of this, it becomes easier to form the resin composition layer thinly and uniformly. Although the lower limit value of the ten-point average roughness, Rzjis, of the surface facing the resin composition layer in the metal foil is not particularly limited, the Rzjis is preferably 0.005 μm or more, more preferably 0.01 μm or more, and still more preferably 0.05 μm or more, from the viewpoint of improving the adhesion to the resin composition layer.

The maximum height Sz on the surface of the copper layer 36 on the side in contact with the resin layer 34 is preferably 6.8 μm or less, more preferably 0.15 μm or more and 6.8 μm or less, still more preferably 0.25 μm or more and 5.0 μm or less, and particularly preferably 0.3 μm or more and 3.0 μm or less. Within such ranges, high capacitor capacitance and high voltage endurance can be demonstrated while ensuring sufficient adhesion to the resin layer 34. Note that, as used herein, the "maximum height Sz" is a parameter that represents the distance from the highest point to the lowest point of the surface, as measured in accordance with ISO 25178.

The kurtosis Sku on the surface of the copper layer 36 on the side in contact with the resin layer 34 is preferably 2.0 or more and 4.0 or less, more preferably 2.2 or more and 3.8 or less, and still more preferably 2.4 or more and 3.5 or less. Within such ranges, variation in capacitor capacitance can be reduced. Note that the "kurtosis Sku" in the present invention is a parameter that represents the sharpness of the height distribution, as measured in accordance with ISO 25178, and is also referred to as the degree of peakedness. Sku=3 means that the height distribution is a normal distribution, Sku>3 means that the surface has many sharp peaks and valleys, and Sku<3 means that the surface is flat.

The maximum peak height Sp on the surface of the copper layer 36 on the side in contact with the resin layer 34 is preferably 3.3 μm or less, more preferably 0.06 μm or more and 3.1 μm or less, still more preferably 0.06 μm or more and 3.0 μm or less, and particularly preferably 0.07 μm or more and 2.9 μm or less. Within such ranges, high capacitor capacitance and high voltage endurance can be demonstrated while ensuring sufficient adhesion to the resin layer 34. Note that, as used herein, the "maximum peak height Sp" is a three-dimensional parameter that represents the maximum value of the height from the average surface of the surface, as measured in accordance with ISO 25178.

The root mean square gradient Sdq on the surface of the copper layer 36 on the side in contact with the resin layer 34 is preferably 0.01 or more and 2.3 or less, more preferably 0.02 or more and 2.0 or less, and still more preferably 0.04 or more and 1.8 or less. Within such ranges, transmission loss can be desirably reduced while ensuring sufficient adhesion to the resin layer 34. High capacitor capacitance and high voltage endurance can be demonstrated. Note that, as used herein, the "root mean square gradient Sdq" is a parameter calculated from the root mean square of the gradient at all points in the defined region, as measured in accordance with ISO 25178. That is, it is a three-dimensional parameter that evaluates the magnitude of the local slope angle, and thus can numericize the steepness of the surface irregularities. For example, the Sdq on a perfectly flat surface is 0, and if the surface is sloped, the Sdq becomes larger. The Sdq of a plane composed of a 45 degree sloped component is 1.

The above-mentioned maximum height Sz, kurtosis Sku, maximum peak height Sp, and root mean square gradient Sdq can be calculated by measuring the surface profile of a predetermined measurement area (for example, a region of 10000 $\mu m^2$) on the copper foil surface with a commercially available laser microscope.

The thickness of the resin layer 34 may be determined so as to realize the thickness of the dielectric layer 38, which will be described later. Accordingly, the preferred range with respect to the thickness of the dielectric layer 38, which will be described later, applies directly to the resin layer 34.

The resin in a semi-cured state constituting the resin layer 34 preferably contains a thermoplastic component and/or a thermosetting resin component. Specifically, it preferably contains at least one selected from the group consisting of epoxy resins, polyethylene terephthalate resins, polyethylene naphthalate resins, polyvinylcarbazole resins, polyphenylene sulfide resins, polyamide resins, aromatic polyamide resins, polyamideimide resins, polyimide resins, polyethersulfone resins, polyethernitrile resins, polyether ether ketone resins, polytetrafluoroethylene resins, urethane resins, isocyanate resins, active ester resins, phenolic resins, and diamine compounds, and more preferably contains at least one selected from the group consisting of epoxy resins, polyimide resins, aromatic polyamide resins, active ester resins, phenolic resins, and diamine compounds.

The resin in a semi-cured state constituting the resin layer 34 may further contain a dielectric filler. The dielectric filler is preferably a composite metal oxide containing at least two selected from the group consisting of Ba, Ti, Sr, Pb, Zr, La, Ta, Ca, and Bi. This composite metal oxide more preferably contains at least two selected from the group consisting of Ba, Ti, and Sr. The composite metal oxide preferably contains at least one selected from the group consisting of $BaTiO_3$, $SrTiO_3$, $BaTi_4O_9$, $Pb(Zr, Ti)O_3$, $PbLaTiO_3$, PbLaZrO, and $SrBi_2Ta_2O_9$, and more preferably contains at least one selected from the group consisting of $BaTiO_3$ and $SrTiO_3$. Note that Pb(Zr, Ti)$O_3$ means $Pb(Zr_xTi_{1-x})O_3$, wherein 0≤x≤1, typically 0<x<1. It is preferable to use a dielectric filler that is a composite metal oxide. In the case where a dielectric filler is used, the dielectric filler is preferably contained in an amount of 0 parts by weight or more and 90 parts by weight or less, more preferably in an amount of 15 parts by weight or more and 85 parts by weight or less, and still more preferably in an amount of 25 parts by weight or more and 80 parts by weight or less, relative to 100 parts by weight of the solid content of the resin composition. Note that, although the resin composition is in a semi-cured state in the step (f), the "solid content of the resin composition" referred to here shall mean the components (resin components, dielectric filler, and others) that constitute the solid content in the resin composition after curing. Although the particle size of the dielectric filler that is a composite metal oxide is not particularly limited, from the viewpoint of maintaining the adhesion between the adhesive layer and the copper foil, the average particle size $D_{50}$ as measured by laser diffraction scattering particle size distribution measurement is preferably 0.001 μm or more and 2.0 μm or less, more preferably 0.01 μm or more and 1.8 μm or less, and still more preferably 0.03 μm or more and 1.6 μm or less.

The resin composition may further contain a filler dispersant. By further containing a filler dispersant, the dispersibility of the dielectric filler can be improved when the resin varnish and the dielectric filler are mixed together. As the filler dispersant, any usable known filler dispersant can be used as appropriate, and there is no particular limitation. Preferred examples of the filler dispersant include an ionic dispersant such as phosphonic acid, cationic, carboxylic acid, and anionic dispersants, as well as a nonionic dispersant such as ether, ester, sorbitan ester, diester, monoglyceride, ethylene oxide adduct, ethylene diamine-based, and phenolic dispersants. In addition, examples thereof include a coupling agent such as a silane coupling agent, a titanate coupling agent, and an aluminate coupling agent.

A curing accelerator may be added to the resin composition in order to accelerate the curing of the resin components. Preferred examples of the curing accelerator include an imidazole-based curing accelerator and an amine-based curing accelerator. From the viewpoint of storage stability of the resin components contained in the resin composition and efficiency of curing, the content of the curing accelerator is preferably 0.01 parts by weight or more and 3.0 parts by weight or less, more preferably 0.1 parts by weight or more and 2.0 parts by weight or less, relative to 100 parts by weight of the non-volatile components in the resin composition.

(g) Curing of Resin

As shown in FIG. 1B (vii), the resin in a semi-cured state is cured to form the dielectric layer 38, thereby obtaining a built-in capacitor circuit. In this way, the printed wiring board with built-in capacitor 40 is obtained. Curing of the resin is preferably performed by heat pressing a laminated body of the resin-coated copper foil 32 and the embedded circuit board 30. Although the temperature for the heat pressing may be set as appropriate depending on the characteristics of the resin, the pressing may be performed at a temperature of preferably 120° C. or higher and 240° C. or lower, more preferably 140° C. or higher and 220° C. or lower, and preferably for 30 minutes or longer and 180 minutes or shorter, more preferably for 60 minutes or longer and 120 minutes or shorter. The pressing is preferably performed by vacuum pressing. As described above, in the method of the present invention, the resin-coated copper foil 32 containing a resin in a semi-cured state is laminated in the final step after the formation of the embedded circuit board 30, and therefore, various steps that may apply stress to the resin layer 34, which will serve as the dielectric layer 38, such as those described above, can be avoided, and as a result, the risk of breakage of the resin layer 34 can be significantly reduced.

The thickness of the dielectric layer 38 is 30 μm or less, preferably 16 μm or less, more preferably 12 μm or less, still more preferably 10 μm or less, and particularly preferably 5 μm or less, from the viewpoint of realizing high capacitance of the capacitor. Although the lower limit value of the thickness of the dielectric layer 38 is not particularly limited as long as the thickness does not allow a short circuit between the circuit 20 and the copper layer 36 facing each other via the dielectric layer 38, it is preferably 0.1 μm or more, more preferably 0.5 μm or more.

The thickness variation in the dielectric layer 38 is preferably ±15% or less, more preferably ±10% or less, and still more preferably ±8% or less. This small thickness variation in the dielectric layer 38 prevents variation in the capacitance of the capacitor from occurring. The thickness variation in the dielectric layer 38 is a value defined as follows: measure a total of at least 10 points by magnifying (for example, magnify at least 500 times) the cross-section of the center of the dielectric layer 38 and its edges (for example, the four corners if the dielectric layer 38 is rectangular) in the thickness direction; find the maximum value, minimum value, and average value of them; and use the larger numerical value among the numerical values (unit: %) represented by the following formulas (1) and (2) as the thickness variation.

$$[100\times(\text{maximum value}-\text{average value})/\text{average value}] \quad (1)$$

$$[100\times(\text{average value}-\text{minimum value})/\text{average value}] \quad (2)$$

The dielectric layer 38 preferably has a relative permittivity of 2.5 or more, more preferably 10 or more, and still more preferably 20 or more. With such a high relative permittivity, the capacitance can be easily increased while making the dielectric layer 38 thinner. Since a higher relative permittivity of the dielectric layer 38 is desirable, the upper limit value is not particularly limited, but it is preferably 300 or less, more preferably 200 or less, and still more preferably 100 or less, from the viewpoint of adhesion to the metal foil and the strength of the dielectric layer. As used herein, the relative permittivity shall mean the value measured by the split post dielectric resonance method (frequency used: 1 GHZ).

The adhesion strength between the dielectric layer 38 and the circuit 20 can be indirectly evaluated by measuring the adhesion strength between the copper layer 36 and the dielectric layer 38. The adhesion strength between the dielectric layer 38 and the circuit 20 and the adhesion strength between the copper layer 36 and the dielectric layer 38 are preferably 0.3 kN/m or more, more preferably 0.4 kN/m or more, and still more preferably 0.5 kN/m or more.

(h) Production of Multilayer Printed Wiring Board

By laminating a plurality of built-in capacitor circuits produced by the method of the present invention, a multilayer printed wiring board can be produced. That is, according to a preferred aspect of the present invention, there is provided a method for producing a multilayer printed wiring board, including the step of laminating a plurality of built-in capacitor circuits produced by the method of the present invention.

EXAMPLES

The present invention will be described more specifically by the following examples.

Example 1

(1) Fabrication of Embedded Circuit Board

Two sheets of prepreg (manufactured by Panasonic Corporation, R-1661, thickness: 100 μm) were stacked to provide a first resin substrate as a dummy core. On this first resin substrate, a carrier-attached copper foil (manufactured by Mitsui Mining & Smelting Co., Ltd., carrier thickness: 18 μm, first copper layer (ultra-thin copper layer) thickness: 3 μm, organic release layer) was laminated such that the carrier and the first resin substrate are in contact with each other. This lamination was performed by performing vacuum pressing at 190° C. for 90 minutes. On the first copper layer of the laminated body obtained, a circuit with L/S=15 μm/15 μm was formed by the modified semi-additive process (MSAP).

Subsequently, a sheet of prepreg (manufactured by Panasonic Corporation, R-1661, thickness: 100 μm) was laminated onto the laminated body as a second resin substrate such that the circuit of the above laminated body was embedded, and on this second resin substrate, a copper foil (manufactured by Mitsui Mining & Smelting Co., Ltd., thickness: 18 μm, surface roughness Rzjis=0.5 μm) was laminated as a second copper layer. In this way, a copper clad laminate with a configuration in which the circuit is embedded in the second resin substrate was obtained.

The first resin substrate and the carrier were separated and removed from the first copper layer via the release layer. The first copper layer present on the surface of the remaining laminated body was etched away to expose the circuit embedded in the second resin substrate on the surface. At this time, the etching was finished when the circuit embedded in the second resin substrate was exposed on the surface, so that no difference in height between the surface of the second resin substrate and the surface of the embedded circuit would be generated. In this way, an embedded circuit board was obtained.

(2) Provision of Resin-Coated Copper Foil

A resin-coated copper foil containing a resin layer composed of a resin varnish A in a semi-cured state and a copper layer was fabricated and evaluated according to the following procedure. Note that the surface property parameters of the copper foil described later were measured by the following procedure.

(Surface Property Parameters of Copper Foil)

By surface roughness analysis using a laser microscope (manufactured by Olympus Corporation, OLS5000), the surface of the copper layer on the side in contact with the resin layer was measured in accordance with ISO 25178. Specifically, the surface profile of a region with an area of 16384 $\mu m^2$ on the surface of the copper layer on the side in contact with the resin layer was measured using the above laser microscope using a 100 times lens with a numerical aperture (N.A.) of 0.95. Noise removal and primary linear surface inclination correction were performed on the obtained surface profile, and then measurements of the maximum height Sz, kurtosis Sku, maximum peak height Sp, and root mean square gradient Sdq were performed by surface property analysis. In all cases, the measurements were performed with the cutoff wavelength by the S filter set to 0.55 μm and the cutoff wavelength by the L filter set to 10 μm.

(2a) Preparation of Resin Varnish A

The resin components and imidazole-based curing accelerator shown below were provided as raw material components for resin varnish.

- Biphenyl-aralkyl epoxy resin (manufactured by Nippon Kayaku Co., Ltd., NC-3000): 51 parts by weight
- Polyfunctional phenolic resin (curing agent, manufactured by Meiwa Plastic Industries, Ltd., MEH-7500): 18 parts by weight
- Phenolic hydroxyl group-containing polybutadiene-modified aromatic polyamide resin (manufactured by Nippon Kayaku Co., Ltd., BPAM-155): 31 parts by weight
- Imidazole-based epoxy resin curing accelerator (manufactured by Shikoku Chemicals Corporation, 2P4 MHZ): 0.4 parts by weight The raw material components for resin varnish were weighed. Thereafter, a cyclopentanone solvent was weighed, and the raw material components for resin varnish and the cyclopentanone solvent were put into a flask and stirred at 60° C. After confirming that there was no undissolved residue of raw materials in the resin varnish and that the resin varnish was clear, the resin varnish A was collected.

(2b) Application of Resin Varnish A to Copper Foil

The obtained resin varnish A was applied to the surface of a copper foil (manufactured by Mitsui Mining & Smelting Co., Ltd., thickness 18 μm, surface roughness Rzjis=0.6 μm, maximum height Sz=0.14, kurtosis Sku=3.50, maximum peak height Sp=0.085, and root mean square gradient Sdq=0.053) using a bar coater such that the thickness of the resin layer after drying was about 5 μm, and then dried in an oven heated to 150° C. for 3 minutes to make the resin layer in a semi-cured state.

(2c) Confirmation of Semi-Cured State of Resin by Rigid-Body Pendulum Testing Instrument The obtained resin-coated copper foil was cut into a size of 150 mm×150 mm, and set on the heating stage of a rigid-body pendulum type physical properties testing instrument (manufactured by A&D Co., Ltd., RPT-3000 W). Measurement of the logarithmic decrement was performed in the temperature range of 30° C. to 220° C., setting the temperature increase rate of the heating stage to 5° C./minute, and the maximum value of the logarithmic decrement measured was confirmed. This measurement was performed in accordance with ISO12013-1 or ISO12013-2.

(3) Fabrication of Built-In Capacitor Circuit Board

The embedded circuit board obtained in the above (1) was placed with the embedded circuit side facing up, and the resin-coated copper foil obtained in the above (2) was superimposed on top of it with the resin layer facing down. Thereafter, vacuum pressing was performed at 180° C. for 120 minutes to make the resin layer in a cured state, thereby obtaining a built-in capacitor circuit board.

(4) Confirmation of Adhesion Between Embedded Circuit and Resin-Coated Copper Foil The obtained built-in capacitor circuit board was cut into a size of about 8 mm in width and 5 mm in length, and then cut out in the thickness direction of the built-in capacitor circuit board using a microtome (Leica Biosystems, RM2265, fully automatic universal rotary microtome) to expose the embedded circuit cross-section. That cross-section was observed with an optical microscope (Leica Microsystems, Leica DM LM) and FE-SEM to evaluate the presence or absence of defects (for example, locations of incomplete adhesion) on the adhesion surface between the embedded circuit and the resin-coated copper foil.

Also, the circuit adhesion strength was measured as follows. After fabricating a straight-line circuit with a width of 3 mm by etching the surface on the resin-coated copper foil side of the obtained built-in capacitor circuit board, the circuit was peeled off using Autograph at a peeling speed of 50 mm/minute and its peel strength was measured at normal temperature (for example, 25° C.). This measurement was performed in accordance with IPC-TM-650 2.4.8. As a result, the adhesion between the embedded circuit and the resin-coated copper foil was indirectly evaluated.

Based on the evaluation results obtained, the adhesion between the embedded circuit and the resin-coated copper foil was rated according to the following criteria.

Evaluation A: There are no defects on the adhesion surface between the embedded circuit and the resin-coated copper foil, and the circuit adhesion strength is 0.4 kgf/cm or more.

Evaluation B: There are no defects on the adhesion surface between the embedded circuit and the resin-coated copper foil, but the circuit adhesion strength is less than 0.4 kgf/cm.

Evaluation C: There are defects on the adhesion surface between the embedded circuit and the resin-coated copper foil.

(5) Evaluation of Dielectric Layer

The following evaluation was performed on the dielectric layer in the built-in capacitor circuit board obtained in the above (3).

<Thickness Variation in Dielectric Layer>

In the same manner as in the above (4), the obtained built-in capacitor circuit board was cut into a size of about 8 mm in width and 5 mm in length, and then cut out in the thickness direction of the built-in capacitor circuit board using a microtome (Leica Biosystems, RM2265, fully automatic universal rotary microtome) to expose the embedded circuit cross-section. That cross-section was observed with an optical microscope (Leica Microsystems, Leica DM LM), and the thickness of the dielectric layer was measured at 10 points.

The maximum value, minimum value, and average value of the thickness of the dielectric layer at the 10 points measured were determined, and the larger numerical value among the numerical values (unit: %) calculated by the following formulas (1) and (2) was employed as the value of thickness variation.

$$[100\times(\text{maximum value}-\text{average value})/\text{average value}] \quad (1)$$

$$[100\times(\text{average value}-\text{minimum value})/\text{average value}] \quad (2)$$

Example 2

Fabrication and evaluation of a built-in capacitor circuit board was performed in the same manner as in Example 1, except that a resin composition in which a dielectric filler was dispersed in a resin varnish B prepared as described below was used instead of the resin varnish A.

(2a') Preparation of Resin Composition

The resin components and imidazole-based curing accelerator shown below were provided as raw material components for resin varnish.

Biphenyl-aralkyl epoxy resin: manufactured by Nippon Kayaku Co., Ltd., NC-3000H: 53 parts by weight Diamine compound (curing agent): manufactured by Wakayama Seika Kougyou Co., Ltd., BAPP (2,2-bis [4-(4-aminophenoxy)phenyl]propane): 17 parts by weight Polyimide resin: manufactured by Arakawa Chemical Industries, Ltd., PIAD-300:30 parts by weight Imidazole-based epoxy resin curing accelerator: manufactured by Shikoku Chemicals Corporation, 2P4 MHZ: 0.5 parts by weight At first, the raw material components for resin varnish were weighed. Thereafter, a cyclopentanone solvent was weighed, and the raw material components for resin varnish and the cyclopentanone solvent were put into a flask and stirred at 60° C. After confirming that there was no undissolved residue of raw materials in the resin varnish and that the resin varnish was clear, the resin varnish B was collected.

Next, the dielectric filler and dispersant shown below were provided.

Barium titanate: manufactured by Nippon Chemical Industrial Co., Ltd.

Titanate coupling agent: manufactured by Ajinomoto Fine-Techno Co., Inc., KR-44 (amount added: 1.5 parts by weight relative to 100 parts by weight of barium titanate)

Thereafter, a cyclopentanone solvent, the dielectric filler, and the dispersant were each weighed. The weighed solvent, dielectric filler, and dispersant were made into a slurry with a dispersing machine. After this slurrification was confirmed, the resin varnish B was weighed such that the final compounding proportion of the dielectric filler was 79 parts by weight relative to 100 parts by weight of the solid content of the resin composition to be finally obtained, and was mixed together with the dielectric filler-containing slurry in a dispersing machine. After mixing, the dielectric filler was confirmed not to be agglomerated, and the resin varnish B in which the dielectric filler was then dispersed was collected.

Example 3

Fabrication and evaluation of a built-in capacitor circuit board was performed in the same manner as in Example 2, except that the drying after applying the resin varnish B to the copper foil was performed at 130° C.

Example 4

Fabrication and evaluation of a built-in capacitor circuit board was performed in the same manner as in Example 2, except that the drying after applying the resin varnish B to the copper foil was performed at 180° C.

Example 5 (Comparative)

Fabrication and evaluation of a built-in capacitor circuit board was performed in the same manner as in Example 2, except that the drying after applying the resin varnish B to the copper foil was performed at 200° C.

Example 6

Fabrication and evaluation of a built-in capacitor circuit board was performed in the same manner as in Example 1, except that the etching removal of the first copper layer was performed by not only exposing the circuit embedded in the second resin substrate on the surface, but also by over-etching until the maximum value of height difference between the surface of the second resin substrate and the surface of the embedded circuit was about 0.2 μm.

Results

The evaluation results of Examples 1 to 6 were as shown in Table 1.

TABLE 1

| | | | | Ex. 1 | Ex. 2 | Ex. 3 | Ex. 4 | Ex. 5* | Ex. 6 |
|---|---|---|---|---|---|---|---|---|---|
| Conditions for fabricating resin-coated copper foil used in step (f) | Preparation of resin varnish | Resin composition | Type of resin varnish | A | B | B | B | B | A |
| | | | Amount of dielectric filler compounded (Parts by weight relative to 100 parts by weight of solid content of resin composition) | 0 | 79 | 79 | 79 | 79 | 0 |
| | Application of resin varnish | Application conditions | Drying temperature (° C.) | 150 | 150 | 130 | 180 | 200 | 150 |
| Evaluation | Height difference between surface of second resin substrate and surface of embedded circuit | | | | | None | | | About 0.2 μm |
| | Logarithmic decrement (maximum value) of resin in semi-cured state measured with rigid-body pendulum testing instrument | | | 0.50 | 0.10 | 0.30 | 0.05 | 0.01 | 0.50 |
| | Thickness variation in dielectric layer (%) | | | ±6 | ±3 | ±3 | ±3 | ±3 | ±6 |
| | Adhesion between embedded circuit board and resin-coated copper foil | | | A | A | A | B | C | A |

The symbol * indicates a comparative example.

The invention claimed is:

1. A method for producing a printed wiring board with built-in capacitor that has a dielectric layer with a thickness of 30 μm or less, the method comprising:

(a) laminating a carrier-attached copper foil comprising a carrier, a release layer, and a first copper layer in sequence, onto at least one side of a first resin substrate such that the carrier is in contact with the first resin substrate;

(b) performing circuit formation on the first copper layer of the carrier-attached copper foil, thereby obtaining a laminated body comprising a circuit on at least one side;

(c) laminating a copper clad laminate containing a second resin substrate and a second copper layer onto the circuit on at least one side of the laminated body such that the circuit is embedded in the second resin substrate;

(d) separating the first resin substrate and the carrier from the first copper layer via the release layer;

(e) etching away the first copper layer to expose, on a surface, the circuit embedded in the second resin substrate, thereby obtaining an embedded circuit board;

(f) laminating the embedded circuit board onto a resin-coated copper foil containing a resin layer composed of a resin in a semi-cured state and a copper layer such that the circuit is in contact with the resin layer, wherein the resin in a semi-cured state has a maximum value of logarithmic decrement of 0.02 or more as measured with a rigid-body pendulum type physical properties testing instrument in a temperature range of 30° C. to 220° C. at a temperature increase rate of 5° C./minute in accordance with ISO 12013-1 or ISO 12013-2; and (g) curing the resin in a semi-cured state to form a dielectric layer with a thickness of 30 μm or less, thereby obtaining a built-in capacitor circuit.

2. The method for producing a printed wiring board with built-in capacitor according to claim 1, wherein the maximum value of logarithmic decrement is 0.2 or more and 2.0 or less.

3. The method for producing a printed wiring board with built-in capacitor according to claim 1, wherein in the embedded circuit board obtained in (e), a maximum value of height difference between a surface of the second resin substrate and a surface of the circuit embedded in the second resin substrate is 0.5 μm or less.

4. The method for producing a printed wiring board with built-in capacitor according to claim 1, wherein a thickness variation in the dielectric layer is ±15% or less.

5. A method for producing a multilayer printed wiring board, comprising laminating a plurality of built-in capacitor circuits produced by the method according to claim 1.

* * * * *